(12) United States Patent
Hao et al.

(10) Patent No.: US 10,802,351 B2
(45) Date of Patent: Oct. 13, 2020

(54) ARRAY SUBSTRATE, DRIVING METHOD THEREOF, AND DISPLAY PANEL

(71) Applicant: BOE TECHNOLOGY GROUP CO., LTD., Beijing (CN)

(72) Inventors: Xueguang Hao, Beijing (CN); Jianbo Xian, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 15/650,486

(22) Filed: Jul. 14, 2017

(65) Prior Publication Data

US 2018/0031928 A1  Feb. 1, 2018

(30) Foreign Application Priority Data

Jul. 26, 2016 (CN) .......................... 2016 1 0596219

(51) Int. Cl.
*G02F 1/1343* (2006.01)
*G09G 3/36* (2006.01)
(Continued)

(52) U.S. Cl.
CPC .. *G02F 1/134309* (2013.01); *G02F 1/136213* (2013.01); *G09G 3/36* (2013.01);
(Continued)

(58) Field of Classification Search
CPC ........ G02F 1/134309; G02F 1/136213; G09G 3/3648; G09G 3/3614; G09G 3/36;
(Continued)

(56) References Cited

U.S. PATENT DOCUMENTS 6,552,706 B1   4/2003 Ikeda et al.
2007/0063233 A1*  3/2007 Joo ................... G02F 1/134336
                                                    257/291
(Continued)

FOREIGN PATENT DOCUMENTS

CN        102466935 A     5/2012
CN        102770802 A    11/2012
(Continued)

OTHER PUBLICATIONS

First Office Action for Chinese Application No. 201610596219.1, dated Sep. 3, 2018, 10 Pages.

*Primary Examiner* — Alexander Eisen
*Assistant Examiner* — Kebede T Teshome
(74) *Attorney, Agent, or Firm* — Brooks Kushman P.C.

(57) ABSTRACT

The present disclosure provides an array substrate, a driving method thereof and a display panel. The array substrate includes: a plurality of pixels arranged in a matrix, wherein two adjacent rows of pixels are grouped into a pixel group; switching elements respectively connected with the pixels; a data line, wherein two data lines corresponds to each column of pixels arranged at two sides of this column respectively; and gate lines each located between two adjacent rows of pixels of each pixel group; wherein respective pixels in a same pixel group are connected with one gate line located between two rows of pixels though respective switching elements; two pixels adjacent to each other along a column direction in a same pixel group are respectively connected with two data lines respectively located at two sides of a column where the two pixels are located through respective switching elements.

17 Claims, 22 Drawing Sheets

(51) Int. Cl.
*G02F 1/1362* (2006.01)
*H01L 21/768* (2006.01)
*H01L 21/77* (2017.01)
*H01L 27/12* (2006.01)

(52) U.S. Cl.
CPC ......... *G09G 3/3614* (2013.01); *G09G 3/3648* (2013.01); *H01L 21/76898* (2013.01); *H01L 21/77* (2013.01); *H01L 27/124* (2013.01); *H01L 27/1225* (2013.01); *G02F 2201/123* (2013.01); *G09G 3/3659* (2013.01); *G09G 3/3677* (2013.01); *G09G 2300/0426* (2013.01); *G09G 2300/0447* (2013.01); *H01L 2021/775* (2013.01)

(58) Field of Classification Search
CPC . G09G 3/3677; H01L 21/76898; H01L 21/77; H01L 27/1225; H01L 27/124
See application file for complete search history.

(56) References Cited

U.S. PATENT DOCUMENTS

| | | |
|---|---|---|
| 2007/0103631 A1 | 5/2007 | Moon et al. |
| 2007/0132684 A1* | 6/2007 | Baek ................... G09G 3/3614 345/87 |
| 2008/0198290 A1* | 8/2008 | Su ....................... G02F 1/13624 349/48 |
| 2012/0105785 A1 | 5/2012 | Kim et al. |
| 2012/0320297 A1 | 12/2012 | Itsumi et al. |
| 2012/0326954 A1* | 12/2012 | Itsumi .................. G02F 1/1368 345/92 |

FOREIGN PATENT DOCUMENTS

| | | |
|---|---|---|
| CN | 202916564 U | 5/2013 |
| CN | 102914924 B | 1/2016 |

* cited by examiner

ARRAY SUBSTRATE, DRIVING METHOD THEREOF, AND DISPLAY PANEL

CROSS-REFERENCE TO RELATED APPLICATION

This application claims priority to Chinese Patent Application No. 201610596219.1 filed on Jul. 26, 2016, the disclosure of which is incorporated by reference herein in its entirety.

TECHNICAL FIELD

The present disclosure relates to a field of display techniques, and in particular to an array substrate, a driving method thereof, and a display panel.

BACKGROUND

A flat panel display device such as a thin film transistor liquid crystal display (Thin Film Transistor Liquid Crystal Display, TFT-LCD), which has features such as a small size, low power consumption, relatively lower manufacturing cost and no radiation, plays a dominant role in a current flat panel display market. A traditional single-domain liquid crystal display can no longer meet requirements for the liquid crystal display. For example, in the traditional single-domain liquid crystal display, all liquid crystals in regions corresponding to respective pixels have a same deflecting direction, which would result in a low contrast ratio, asymmetry of viewing angles, a color shift occurring when viewing a display image from different angles, etc. A multi-domain display technique has developed gradually. In a multi-domain liquid crystal display, a region, for example corresponding to a subpixel, may be further divided into different regions, and liquid crystal molecules in different regions have different degrees of deflection. When viewing the liquid crystal screen from different angles, a difference of contrast ratios at different angles can be reduced, thereby reducing the color shift and increasing the viewing angle.

Currently, there are some methods for implementing a multi-domain liquid crystal display. A pixel in the liquid crystal display may be divided into a plurality of subpixels, liquid crystal molecules in different sub-pixel regions may be formed into different initial arrangements by rubbing alignment, and then a multi-domain state is formed during application of a voltage. Or, several strips of protrusions may be formed below pixel electrodes. As such, an oblique electric field may be formed between the pixel electrodes and common electrodes of an upper substrate, such that the liquid crystal molecules are arranged alone a direction of the electric field to form a multi-domain state. Or, multi-domain display may be realized by constructing multi-domain pixel electrodes. However, all these methods have problems, such as complicated processes, great difficulty in manufacturing, high cost and being difficult to implement.

SUMMARY

In view of the above, embodiments of the present disclosure provide an array substrate, a driving method thereof and a display panel, to realize multi-domain display by designing pixel arrangements.

At least one embodiment of the present disclosure provides an array substrate, including: a plurality of pixels arranged in a matrix and switching elements respectively connected with the pixels; and further including: a data line arranged at each of two sides of each column of pixels, wherein two data lines are arranged between two adjacent columns of pixels.

Taking two adjacent rows of pixels as a pixel group, the array substrate further includes at least one gate line each located between two adjacent rows of pixels of each of the at least one pixel group, wherein two rows of pixels in a same pixel group are connected with one of the at least one gate line that is located between the two rows of pixels though respective switching elements of the two rows of pixels.

Two pixels adjacent to each other along a column direction in a same pixel group are respectively connected with two data lines respectively located at two sides of a column where the two pixels are located through respective switching elements of the two pixels.

Optionally, in the above array substrate provided by the embodiment of the present disclosure, the switching elements are thin film transistors.

Optionally, in the above array substrate provided by the embodiment of the present disclosure, in a same pixel group, respective pixels belonging to a first row have substantially a same area; and respective pixels belonging to a second row have a substantially same area.

Optionally, in the above array substrate provided by the embodiment of the present disclosure, in a same pixel group, a ratio of areas of two pixels adjacent to each other along the column direction is equal to a ratio of channel widths of the transistors corresponding to the two pixels. Further, a ratio of channel widths of transistors respectively corresponding to two pixels adjacent to each other in a column of the same pixel group is substantially equal to that in any other column of the same pixel group.

Optionally, in the above array substrate provided by the embodiment of the present disclosure, in a same column of pixels, a pixel in a first row belonging to an odd-numbered pixel group is connected with a same data line as a pixel in a second row belonging to an even-numbered pixel group; or a pixel in a first row belonging to an odd-numbered pixel group is connected with a same data line as a pixel in a first row belonging to an even-numbered pixel group.

Optionally, the above array substrate provided by the embodiment of the present disclosure further comprises a gate driver connected with each gate line and a source driver connected with each data line; wherein the gate driver is configured to scan gate lines progressively within a period of one frame; and the source driver is configured to apply a data signal to each pixel connected with an $n^{th}$ gate line by applying the data signal to each data line in the case that the gate driver scans the $n^{th}$ gate line, wherein data signals applied by the source driver to any two pixels connected with the $n^{th}$ gate line and adjacent to each other along the column direction have opposite polarities, and n is a integer having a value from 1 to N, and N is the number of the gate lines on the array substrate.

Optionally, in the above array substrate provided by the embodiment of the present disclosure, data signals applied by the source driver to any two pixels adjacent to each other along a row direction have opposite polarities.

Optionally, in the above array substrate provided by the embodiment of the present disclosure, data signals applied by the source driver to any two pixels adjacent to each other along a column direction have opposite polarities.

Optionally, in the above array substrate provided by the embodiment of the present disclosure, data signals applied by the source driver to any two pixels adjacent to each other along a row direction have a same polarity.

Optionally, in the above array substrate provided by the embodiment of the present disclosure, data signals applied by the source driver to all odd-numbered rows of pixels have a same polarity, and data signals applied by the source driver to all even-numbered rows of pixels have a same polarity.

Optionally, in the above array substrate provided by the embodiment of the present disclosure, data signals applied by the source driver to pixels in a first row belonging to any odd-numbered pixel group have a same polarity as data signals applied to pixels in a second row belonging to any even-numbered pixel group.

At least one embodiment of the present disclosure further provides a display panel, including any above-mentioned array substrate provided by the embodiment of the present disclosure.

Accordingly, at least one embodiment of the present disclosure further provides a driving method for the above array substrate, wherein the array substrate further comprises a gate driver connected with the gate line and a source driver connected with the data line. The method includes: scanning, by the gate driver, the gate line; applying, by the source driver, a data signal to each pixel connected with the gate line by applying a data signal to the data line, wherein data signals applied to any two pixels connected with the gate line and adjacent to each other along a column direction have opposite polarities.

Optionally, the plurality of pixels are grouped into a plurality of pixel groups; in a same column of pixels, a pixel in a first row belonging to an odd-numbered pixel group is connected with a same data line as a pixel in a second row of pixels belonging to an even-numbered pixel group; or in a same column of pixels, a pixel in a first row belonging to an odd-numbered pixel group is connected with a same data line as a pixel in a first row belonging to an even-numbered pixel group; and the scanning, by the gate driver, the gate line includes scanning, by the gate driver, gate lines progressively within a period of one frame; the enabling, by the source driver, application of a data signal to each pixel connected with the gate line by applying a data signal to the data line includes: enabling, by the source driver, application of a data signal to each pixel connected with an $n^{th}$ gate line by applying the data signal to each data line, when the gate driver scans the $n^{th}$ gate line, wherein data signals applied by the source driver to any two pixels connected with the $n^{th}$ gate line and adjacent to each other along a column direction have opposite polarities, and n is a integer having a value from 1 to N, and N is the number of gate lines on the array substrate.

Optionally, in the above driving method provided by the embodiment of the present disclosure, data signals applied by the source driver to any two pixels adjacent to each other along a row direction have opposite polarities.

Optionally, in the above driving method provided by the embodiment of the present disclosure, data signals applied by the source driver to any two pixels adjacent to each other along a column direction have opposite polarities.

Optionally, in the above driving method provided by the embodiment of the present disclosure, data signals applied by the source driver to any two pixels adjacent to each other along a row direction have a same polarity.

Optionally, in the above driving method provided by the embodiment of the present disclosure, data signals applied by the source driver to all odd-numbered rows of pixels have a same polarity, and data signals applied by the source driver to all even-numbered rows of pixels have a same polarity.

Optionally, in the above driving method provided by the embodiment of the present disclosure, data signals applied by the source driver to pixels in a first row belonging to any odd-numbered pixel group have a same polarity as data signals applied to pixels in a second row belonging to any even-numbered pixel group.

The present disclosure has the following beneficial effects.

In the array substrate, the driving method thereof and the display panel provided by the embodiments of the present disclosure, data lines are respectively arranged at two sides of each column of pixels, and two data lines are arranged between two adjacent column of pixels; taking two adjacent rows of pixels as a pixel group, a gate line is arranged between two adjacent rows of pixels located in each pixel group, and two rows of pixels in a same pixel group are connected with a gate line located between the two rows of pixels though their respective switching elements; two pixels adjacent to each other along a column direction in a same pixel group are respectively connected with two data lines respectively located at two sides of a column where the two pixels are located through respective switching elements of the two pixels. Since two pixels adjacent to each other along a column direction and connected with a same gate line are connected with two different data lines, such a structure enable different rotation angles of liquid crystal molecules in regions corresponding to the two pixels by respectively controlling voltages of the two data lines, thereby realizing multi-domain display.

DETAILED DESCRIPTION

Figure 1A:
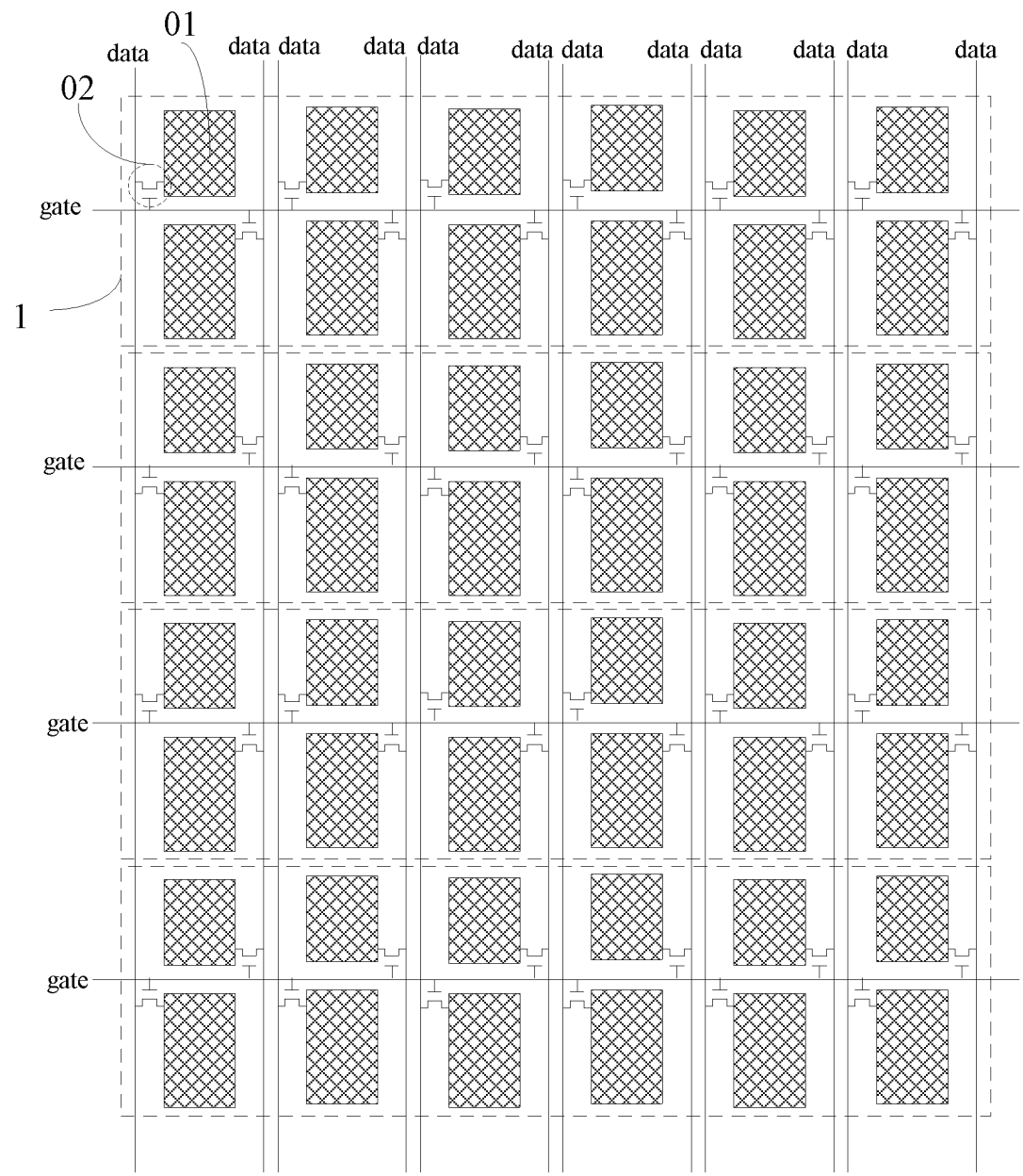
FIGS. 1a to 2b are structural schematic diagrams of an array substrate according to embodiments of the present disclosure, respectively.

In order to make the objectives, the technical solutions and the advantages of the present disclosure clearer, the present disclosure will be further described in detail hereinafter in conjunction with the drawings. Obviously, the described embodiments are merely a part of, rather than all of, the embodiments of the present disclosure. Based on the embodiments of the present disclosure, a person skilled in the art may obtain the other embodiments without any creative efforts, which also fall within the scope of the present disclosure.

An array substrate provided by the present disclosure may be applied to a liquid crystal display. The liquid crystal display may be used as a display screen of a mobile phone, a notebook (Note Book), a global positioning system (GPS), a liquid crystal display television, or the like.

For ease of understanding, an array substrate is illustrated schematically in the drawings, wherein the number of the illustrated components (e.g., the number of pixels, gate lines, data lines, switches, etc.), the spacing between any two components, pixel areas or the like are merely exemplary, and are not to limit the scope of the present disclosure. A shape and size of each component are not used to represent an actual scale of the array substrate, but merely illustrate the present disclosure schematically.

As shown in FIGS. 1a to 2b, an array substrate provided by embodiments of the present disclosure includes a plurality of pixels 01 arranged in a matrix, and switching elements 02 respectively connected with the pixels 01 in one-to-one correspondence. The array substrate further includes: a data line (data) arranged at each of two sides of each column of pixels 01, wherein two data lines are arranged between two adjacent columns of pixels 01. That is, two data lines correspond to each column of pixels arranged at two sides of the each column of pixels respectively.

Taking two adjacent rows of pixels 01 as a pixel group 1, the array substrate further includes at least one gate line (gate) each located between two adjacent rows of pixels 01 of each pixel group 1, wherein two rows of pixels 01 in a same pixel group 1 are respectively connected with one of the at least one gate line located between the two rows of pixels 01 though respective corresponding switching elements 02. In practical application, the at least one gate line may include a plurality of gate lines. The gate lines and the pixel groups are in one-to-one correspondence.

Two pixels 01 adjacent to each other along a column direction in a same pixel group 1 are respectively connected with two data lines respectively located at two sides of a column where the two pixels are located through respective switching elements 02. That is, two pixels 01 adjacent to each other along a column direction are connected with different data lines.

In the above array substrate provided by the embodiments of the present disclosure, data lines are respectively arranged at two sides of each column of pixels, and two data lines are arranged between two adjacent column of pixels; taking two adjacent rows of pixels as a pixel group, at least one gate line each is arranged between two adjacent rows of pixels of each pixel group, and two rows of pixels in a same pixel group are connected with one of the at least one gate line that is located between the two rows of pixels though their respective switching elements; two pixels adjacent to each other along a column direction in a same pixel group are respectively connected with two data lines respectively located at two sides of a column where the two pixels are located through respective switching elements of the two pixels. Since two pixels adjacent to each other along a column direction and connected with a same gate line are connected with two different data lines, such a structure enable different rotation angles of liquid crystal molecules in regions corresponding to the two pixels by respectively controlling voltages of the two data lines, thereby realizing multi-domain display. Furthermore, the array substrate provided by the embodiments of the present disclosure has a relatively simple manufacturing process that is easy to implement.

It should be noted that, in the above array substrate provided by the embodiments of the present disclosure, an extension direction of a gate line may be defined as a row direction, and an extension direction of a data line may be defined as a column direction.

When implementing, in the above array substrate provided by the embodiments of the present disclosure, a switching element may be a transistor such as a thin film transistor. However, no limitation is given on the type of the switching element in the present disclosure, and it may also be a field effect transistor.

Optionally, in the above array substrate provided by the embodiments of the present disclosure, as shown in FIGS. 1a to 2b, in a same pixel group 1, respective pixels 01 belonging to a first row have substantially a same area; and respective pixels 01 belonging to a second row have substantially a same area.

Optionally, in the above array substrate provided by the embodiments of the present disclosure, in a same pixel group, a ratio of areas of two pixels adjacent to each other along a column direction is equal to a ratio of channel widths of thin film transistors corresponding to the two pixels, thereby ensuring synchronization of charging and discharging of the two pixels. Further, a ratio of channel widths of transistors corresponding to two pixels adjacent to each other in a column in a same pixel group is substantially equal to that in any other column of the same pixel group, that is, respective pixels in a same row have a same area.

Figure 1B:
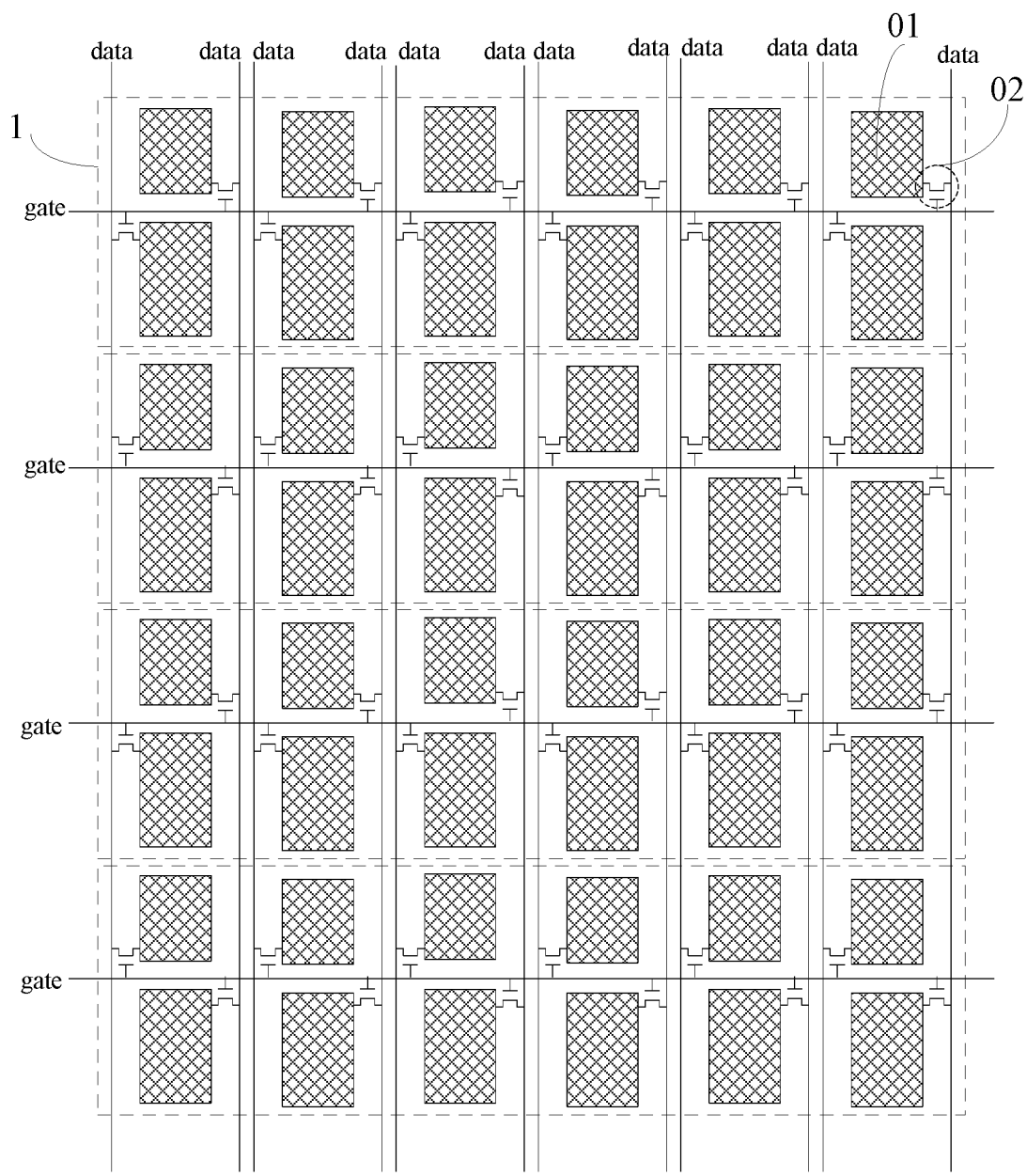

Optionally, to simplify the manufacture, in the above array substrate provided by the embodiments of the present disclosure, as shown in FIGS. 1a and 1b, in a same column of pixels 01, the pixel 01 in a first row belonging to an odd-numbered pixel group 1 in an odd row is connected with a same data line as a pixel 01 in a second row belonging to an even-numbered pixel group 01.

Figure 2A:
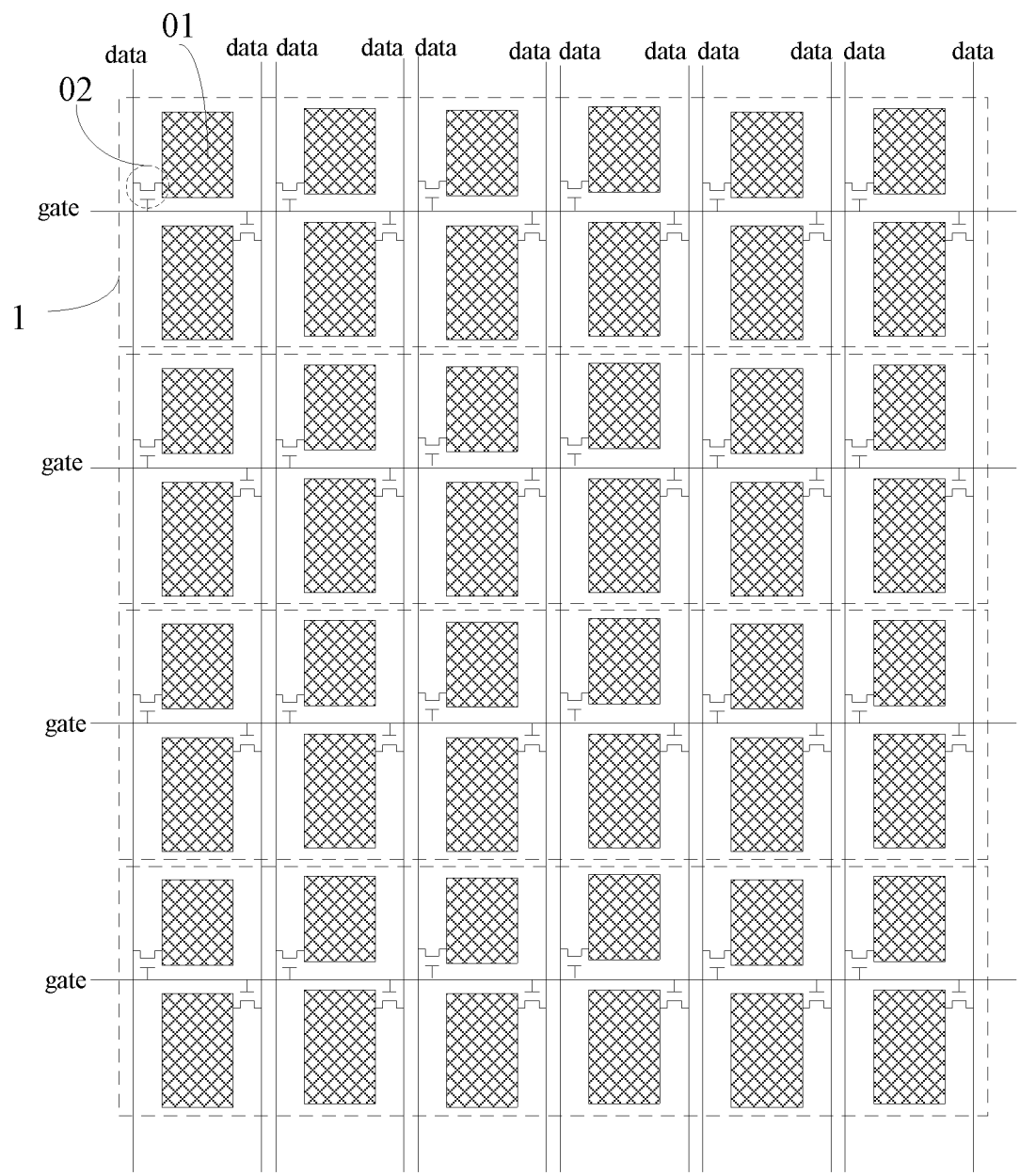
Figure 2B:
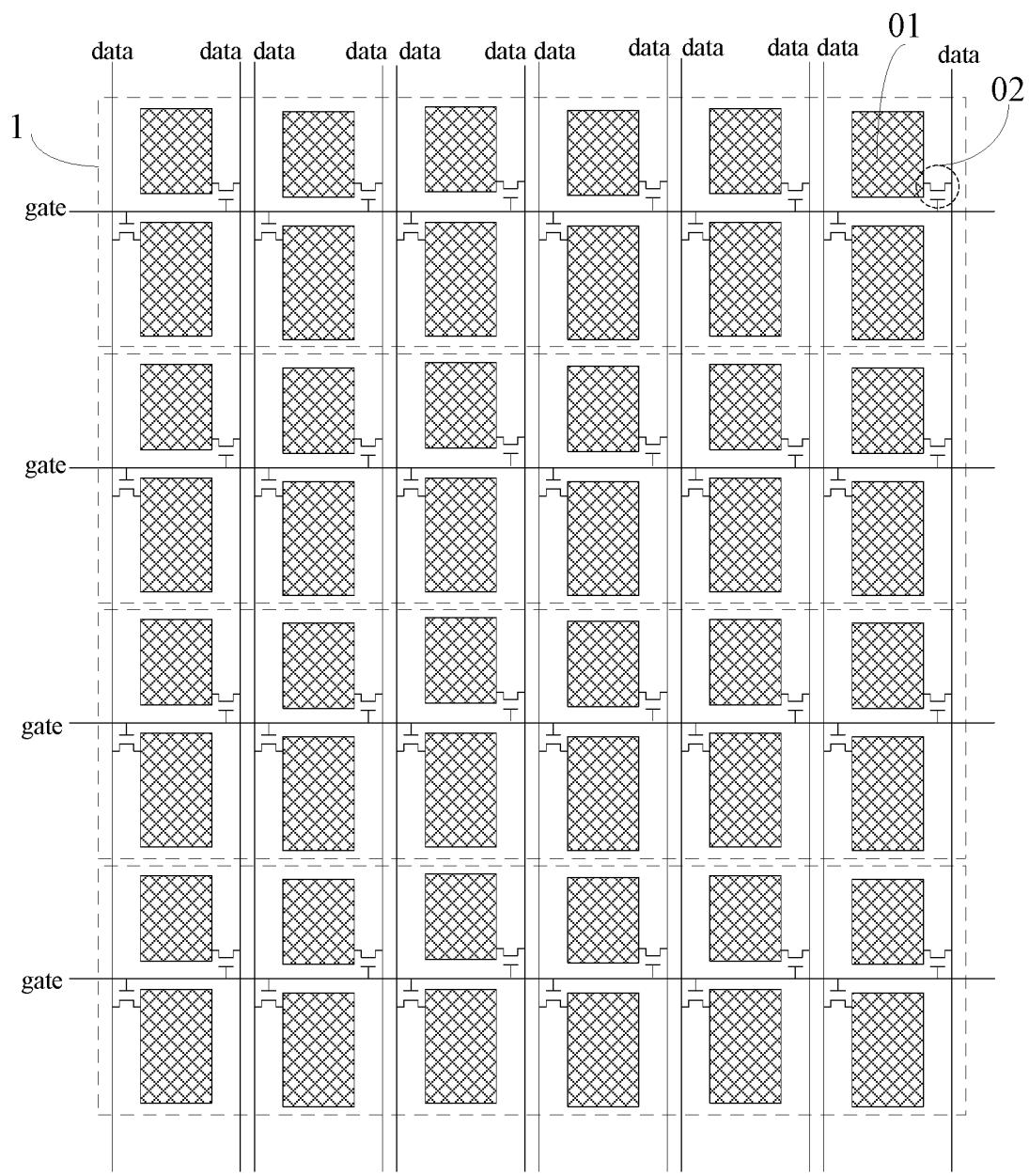

Or, as shown in FIGS. 2a and 2b, in a same column of pixels 01, a pixel 01 of a first row belonging to an odd-numbered pixel group 1 is connected with a same data line as a pixel of a first row belonging to an even-numbered pixel group 1.

The manner in which the above array substrate provided by the embodiments of the present disclosure realizes multi-domain display will be further described in detail below through specific embodiments.

First Embodiment

Further, the above array substrate provided by the embodiments of the present disclosure further includes a gate driver connected with each gate line, and a source driver connected with each data line.

The gate driver is configured to scan gate lines progressively within a period of one frame.

Figure 3A:
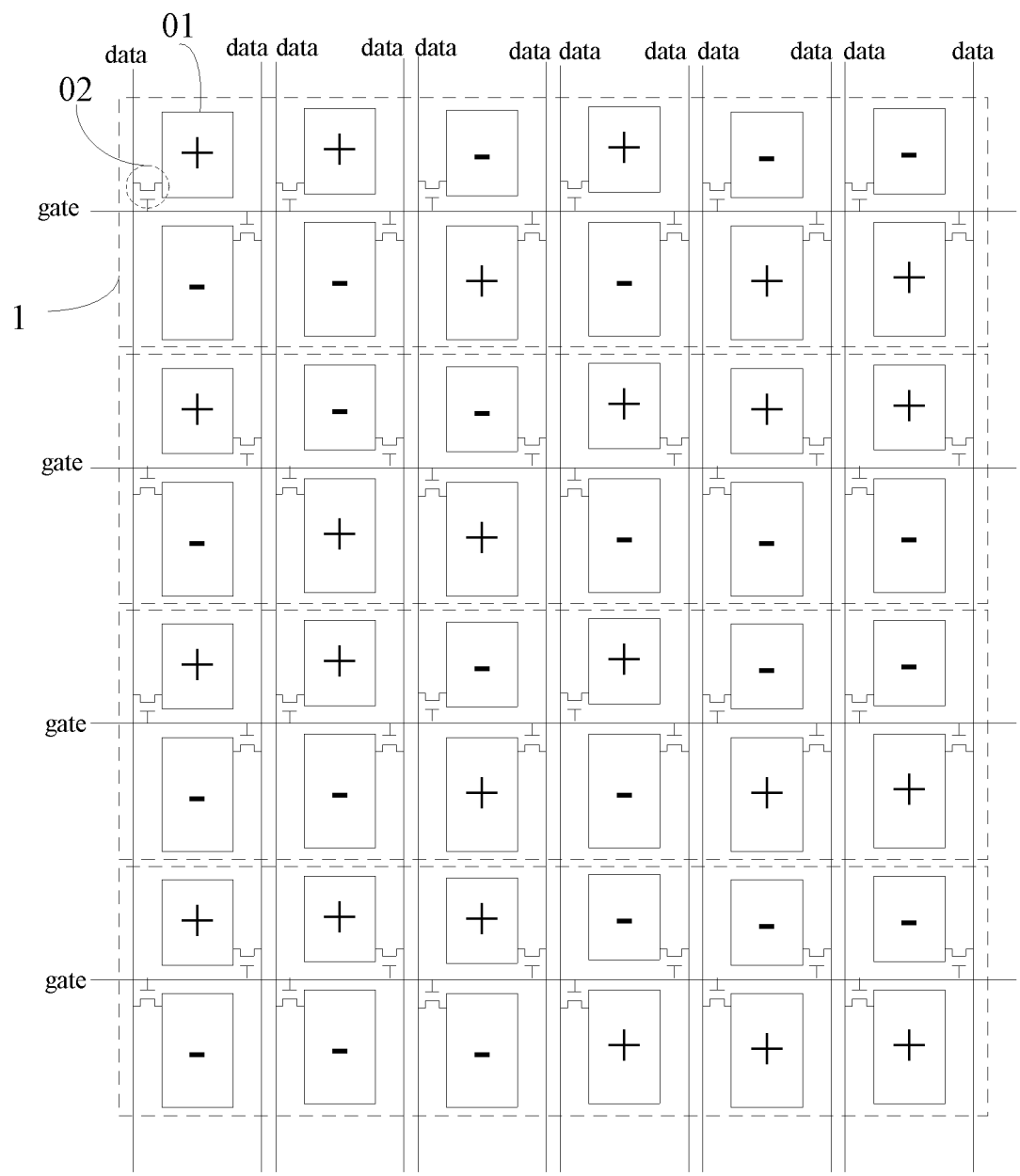
FIGS. 3a and 3b are schematic diagrams of polarity distribution of data signals applied to respective pixels of an array substrate provided by a first embodiment, respectively.
Figure 3B:
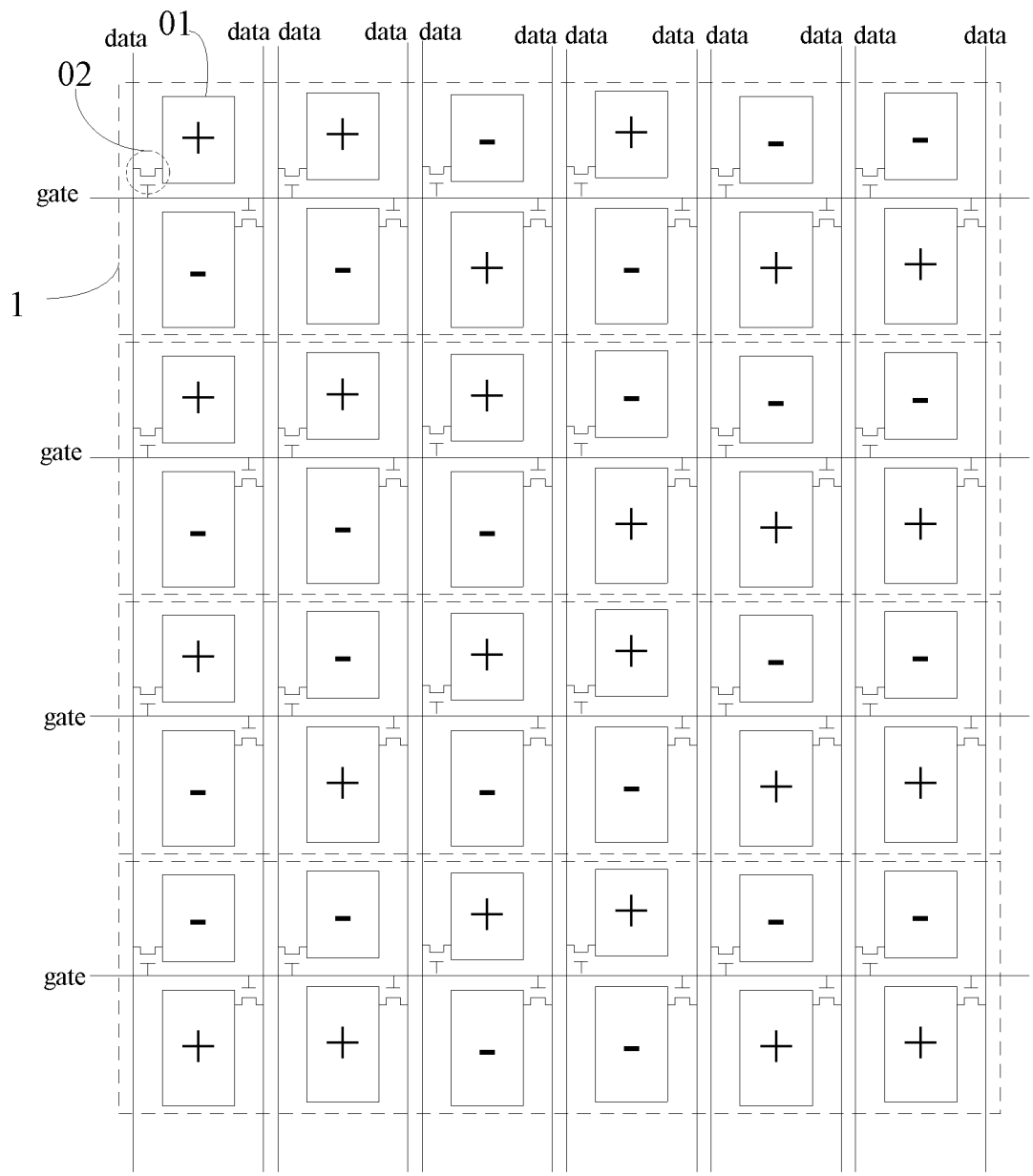

The source driver is configured to apply a data signal to each pixel connected with an $n^{th}$ gate line by applying the data signal to each data line, when the source driver scans the $n^{th}$ gate line, wherein data signals applied by the source driver to any two pixels adjacent to each other along a column direction and connected with the $n^{th}$ gate line have opposite polarities, and N is the number of gate lines on the array substrate and is a integer greater than or equal to 2, and n is a positive integer having a value from 1 to N. Schematic diagrams of polarities of data signals applied to respective pixels 01 of the array substrate within a period of one frame are shown in FIGS. 3a and 3b respectively. As can be seen from FIGS. 3a and 3b, data signals applied to any two pixels 01 adjacent to each other along a column direction in any pixel group 1 have different polarities, such that liquid crystal molecules in regions corresponding to the two pixels 01 have different rotation angles, thereby realizing multi-domain display.

Second Embodiment

Figure 4A:
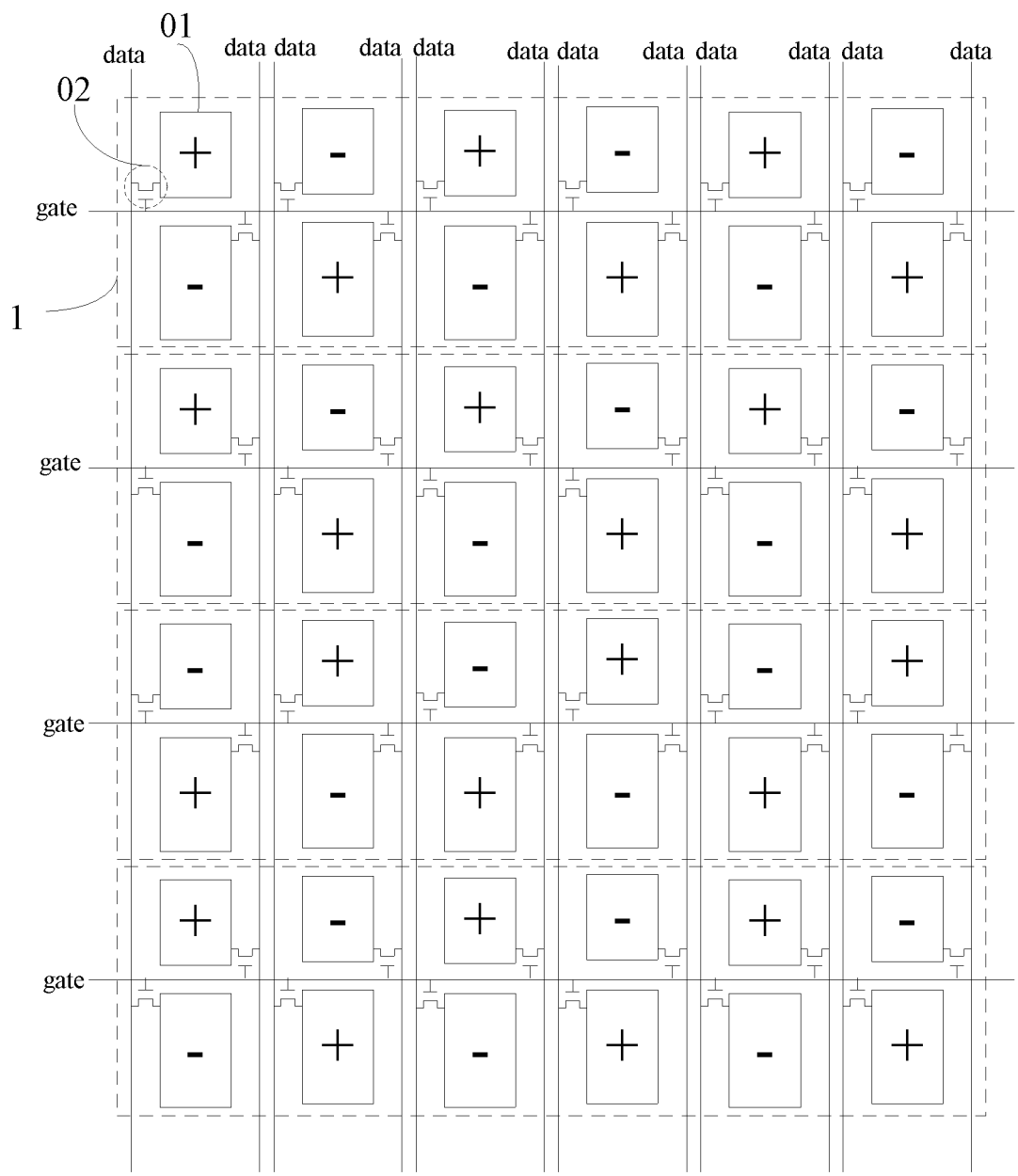
FIGS. 4a and 4b are schematic diagrams of polarity distribution of data signals applied to respective pixels of an array substrate provided by a second embodiment, respectively.
Figure 4B:
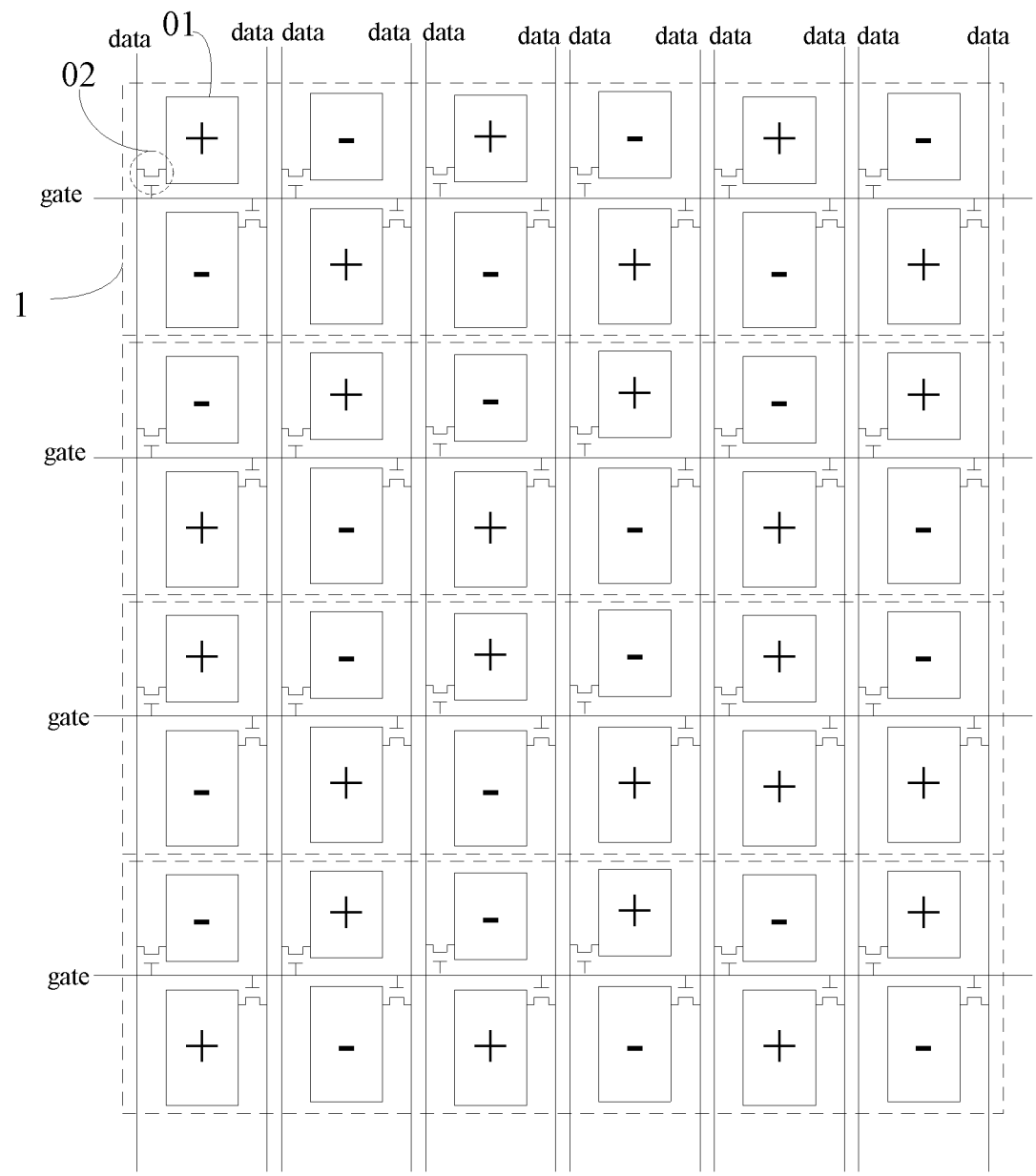

To further improve effects of multi-domain display, on a basis of the array substrate provided by the first embodiment, data signals applied by the source driver to any two pixels adjacent to each other along a row direction have opposite polarities. Schematic diagrams of polarities of data signals applied to respective pixels 01 of the array substrate within a period of one frame are shown in FIGS. 4a and 4b respectively. As can be seen from FIGS. 4a and 4b, data signals applied to any two pixels 01 adjacent to each other along a row direction have different polarities, such that liquid crystal molecules in regions corresponding to the two pixels 01 have different rotation angles, thereby further improving effects of multi-domain display.

Third Embodiment

Figure 5A:
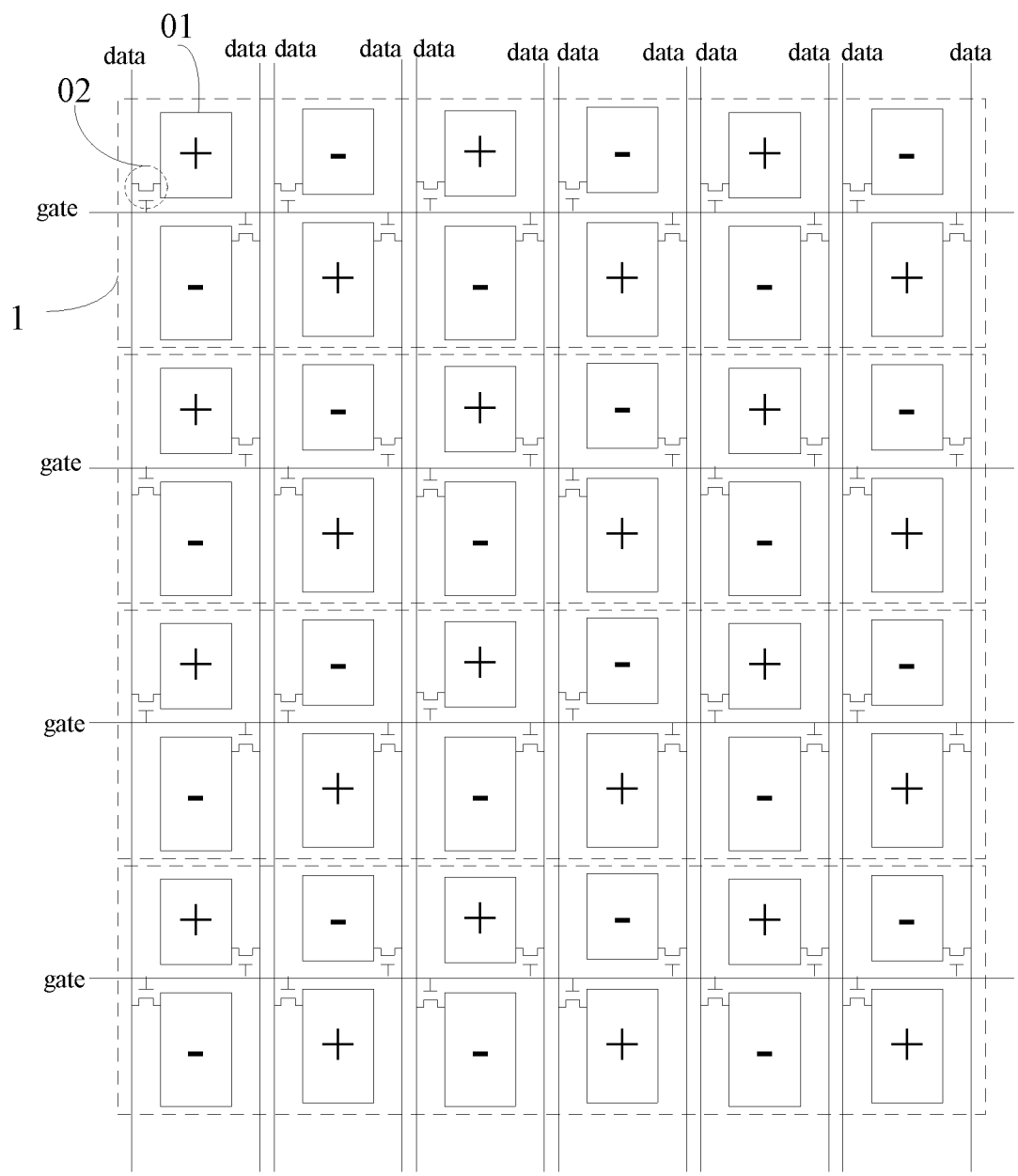
FIGS. 5a and 5b are schematic diagrams of polarity distribution of data signals applied to respective pixels of an array substrate provided by a third embodiment, respectively.
Figure 5B:
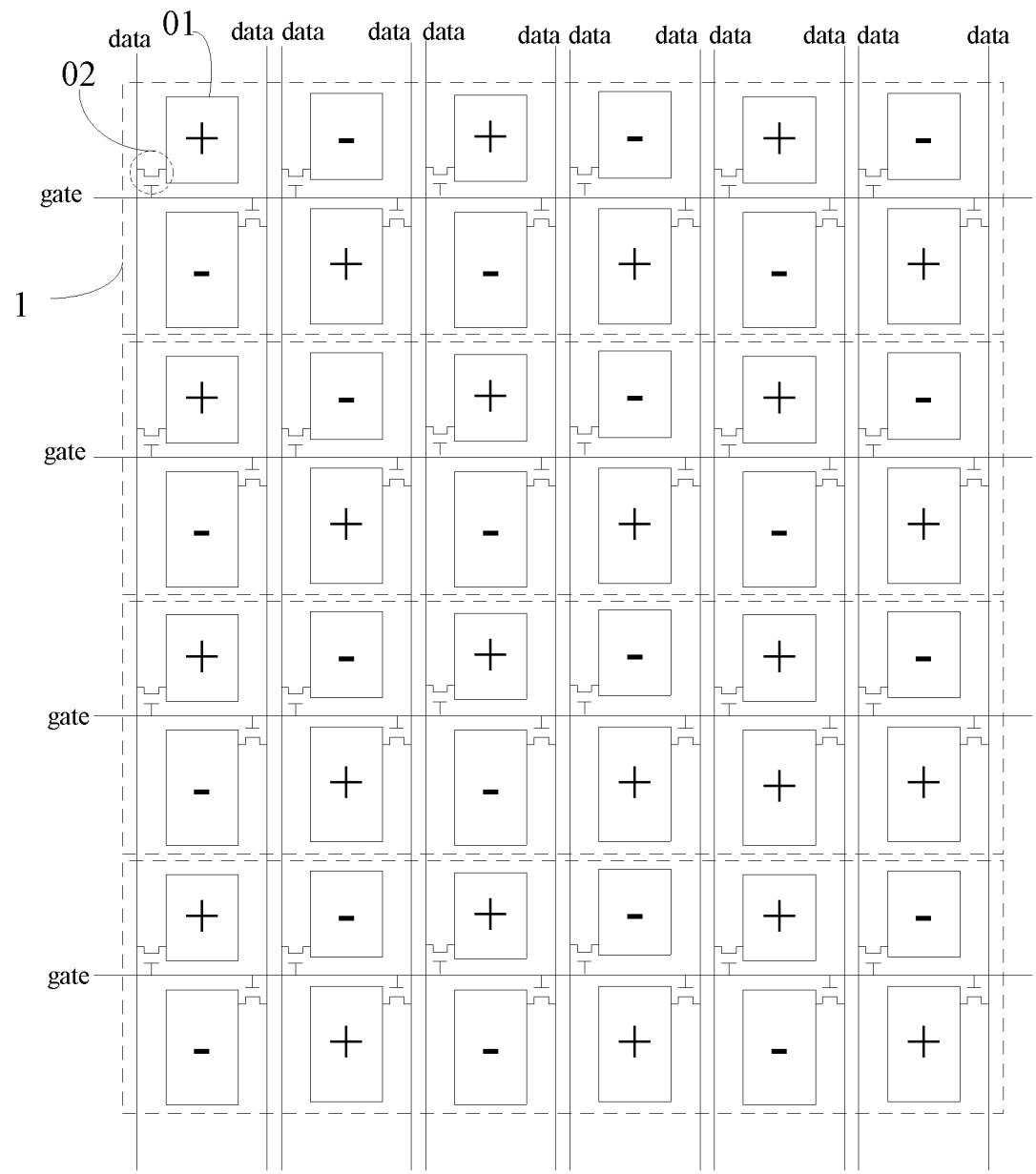
Figure 6A:
FIGS. 6a and 6b are timing diagrams corresponding to the array substrate provided by the third embodiment, respectively.
Figure 6B:

Further, on a basis of the array substrate provided by the second embodiment, data signals applied by the source driver to any two pixels adjacent to each other along a column direction have opposite polarities. Schematic diagrams of polarities of data signals applied to respective pixels 01 of the array substrate within a period of one frame are shown in FIGS. 5a and 5b respectively, and timing diagrams of data signals applied to respective data lines during a frame are shown in FIGS. 6a and 6b respectively. As can be seen from FIGS. 5a and 5b, data signals applied to any two adjacent pixels 01 have different polarities, which is a driving mode also referred to as dot inversion, such that liquid crystal molecules in regions corresponding to any two adjacent pixels 01 have different rotation angles, so as to maximize effects of multi-domain display. And as can be seen from FIGS. 6a and 6b, the driving mode of dot inversion may also be implemented easily through timing control.

Fourth Embodiment

Figure 7A:
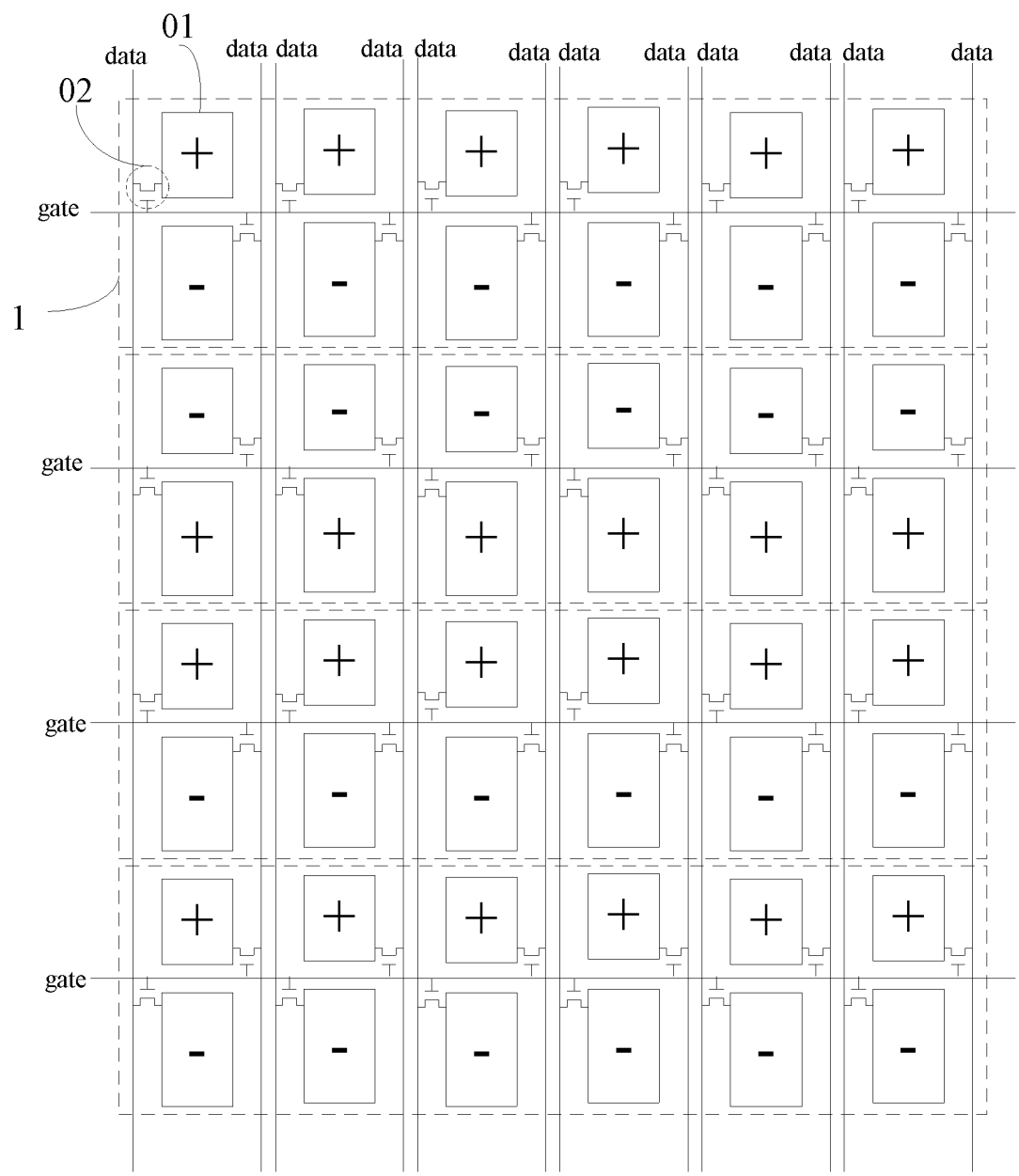
FIGS. 7a and 7b are schematic diagrams of polarity distribution of data signals applied to respective pixels of an array substrate provided by a fourth embodiment, respectively.
Figure 7B:
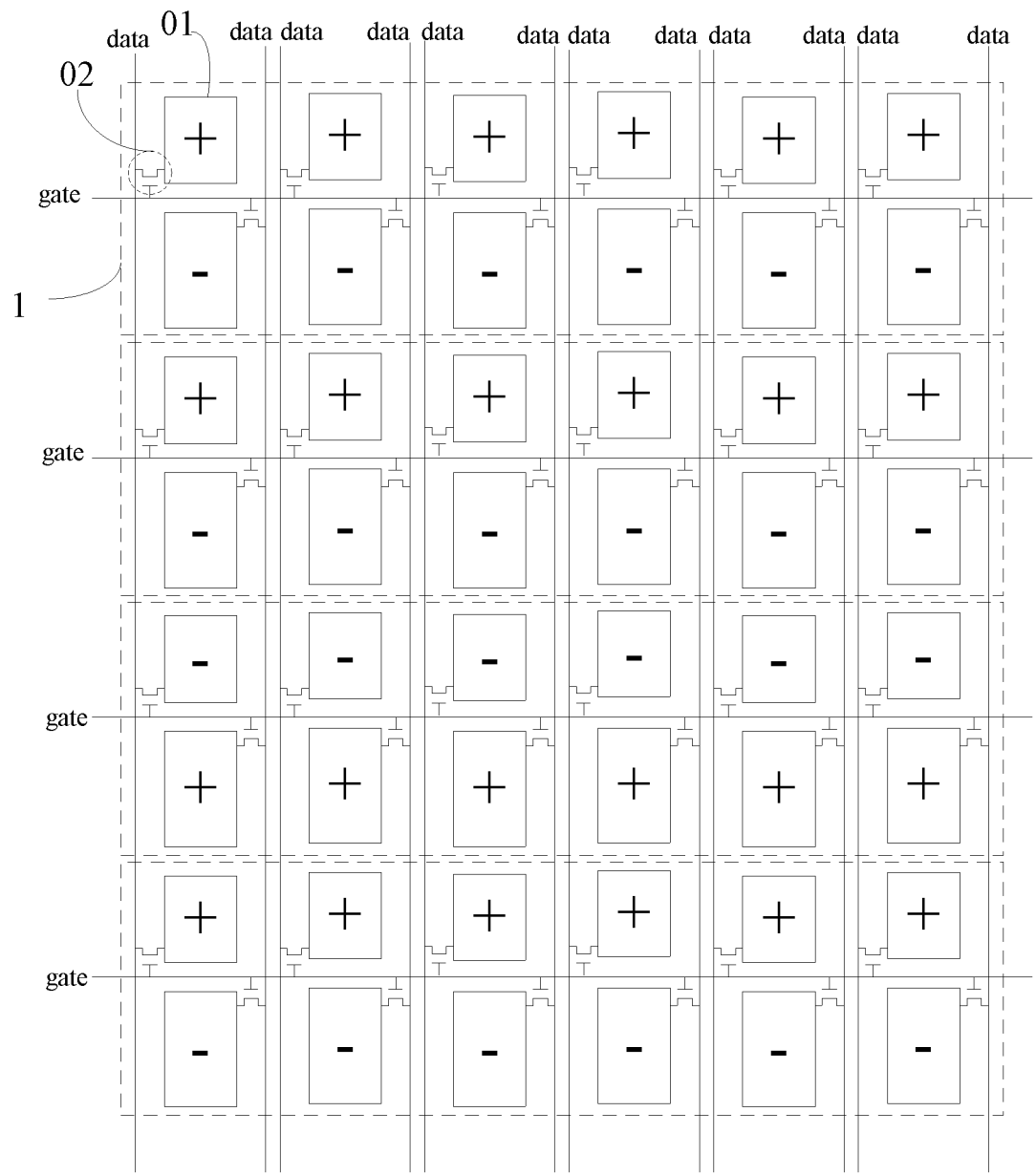

To further improve effects of multi-domain display, on a basis of the array substrate provided by the first embodiment, data signals applied by the source driver to any two pixels adjacent to each other along a row direction have a same polarity. Schematic diagrams of polarities of data signals applied to respective pixels 01 of the array substrate during a frame are shown in FIGS. 7a and 7b respectively. As can be seen from FIGS. 7a and 7b, data signals applied to any two adjacent rows of pixels 01 in a same pixel group 1 have different polarities, such that liquid crystal molecules in regions corresponding to the two rows of pixels 01 have different rotation angles, thereby further improving effects of multi-domain display.

Fifth Embodiment

Figure 8A:
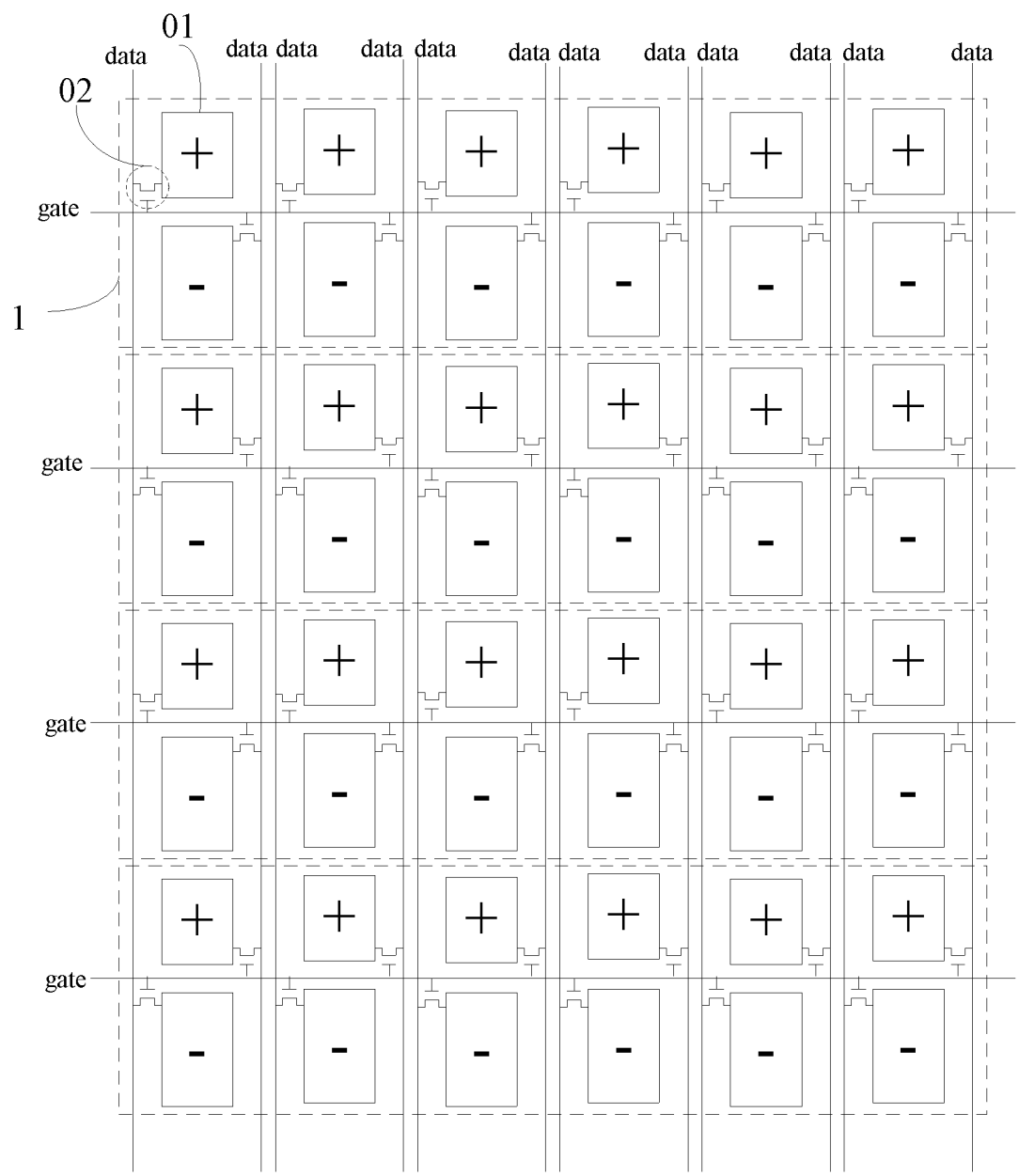
FIGS. 8a and 8b are schematic diagrams of polarity distribution of data signals applied to respective pixels of an array substrate provided by a fifth embodiment, respectively.
Figure 8B:
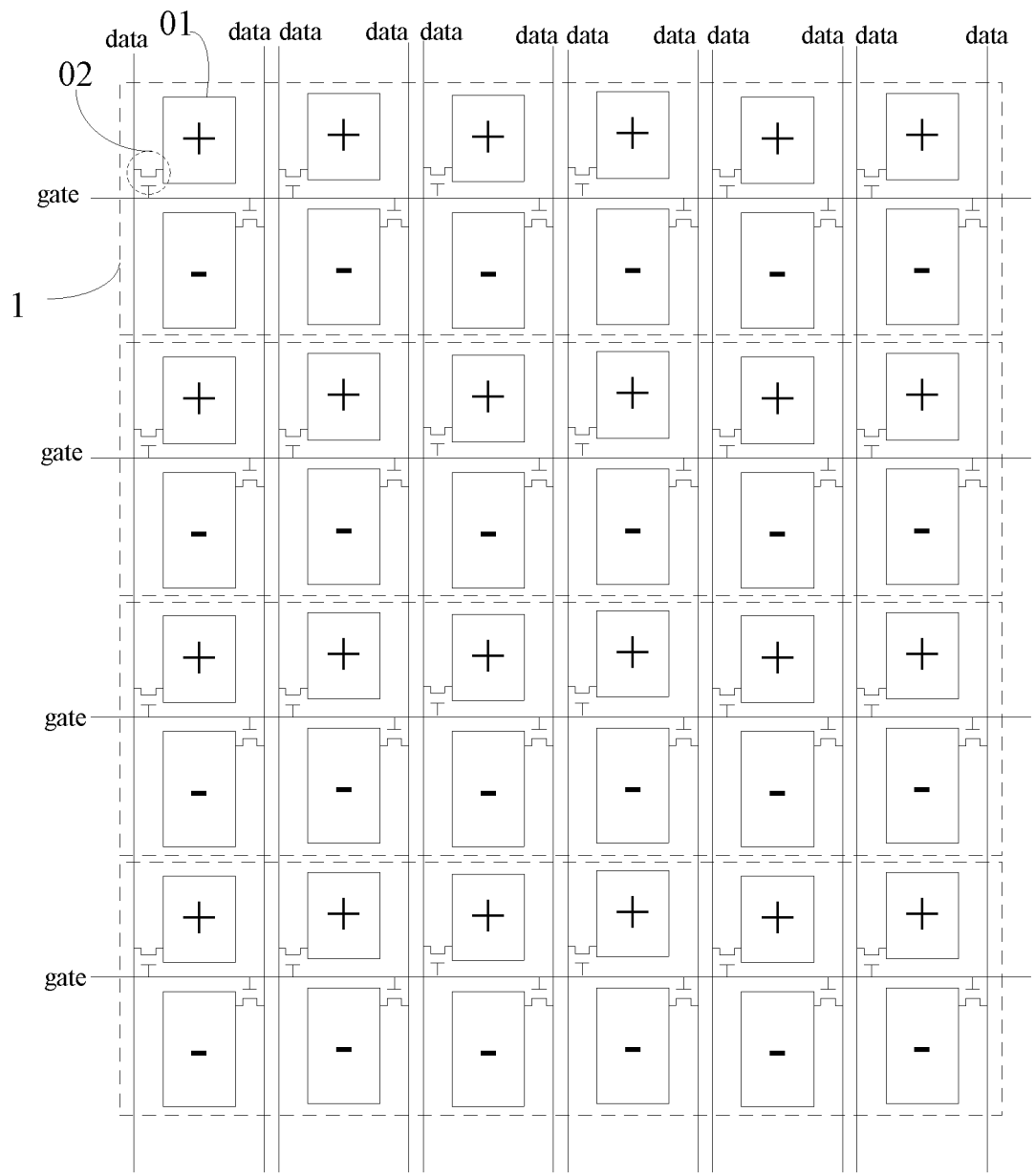
Figure 9A:
FIGS. 9a and 9b are timing diagrams corresponding to the array substrate provided by the fifth embodiment, respectively.
Figure 9B:

Optionally, on a basis of the array substrate provided by the fourth embodiment, data signals applied by the source driver to all odd-numbered rows of pixels have a same polarity, and data signals applied by the source driver to all even-numbered rows of pixels have a same polarity. Schematic diagrams of polarities of data signals applied to respective pixels 01 of the array substrate during a frame are shown in FIGS. 8a and 8b respectively. Timing diagrams of data signals applied to respective data lines during a frame are shown in FIGS. 9a and 9b respectively. As can be seen from FIGS. 8a and 8b, data signals applied to any two adjacent rows of pixels 01 have different polarities, that is, a driving mode of row inversion is employed, such that liquid crystal molecules in regions corresponding to any two adjacent rows of pixels 01 have different rotation angles, thereby achieving effects of multi-domain display. And as can be seen from FIGS. 9a and 9b, the driving mode of row inversion may also be implemented easily through timing control.

Sixth Embodiment

Figure 10A:
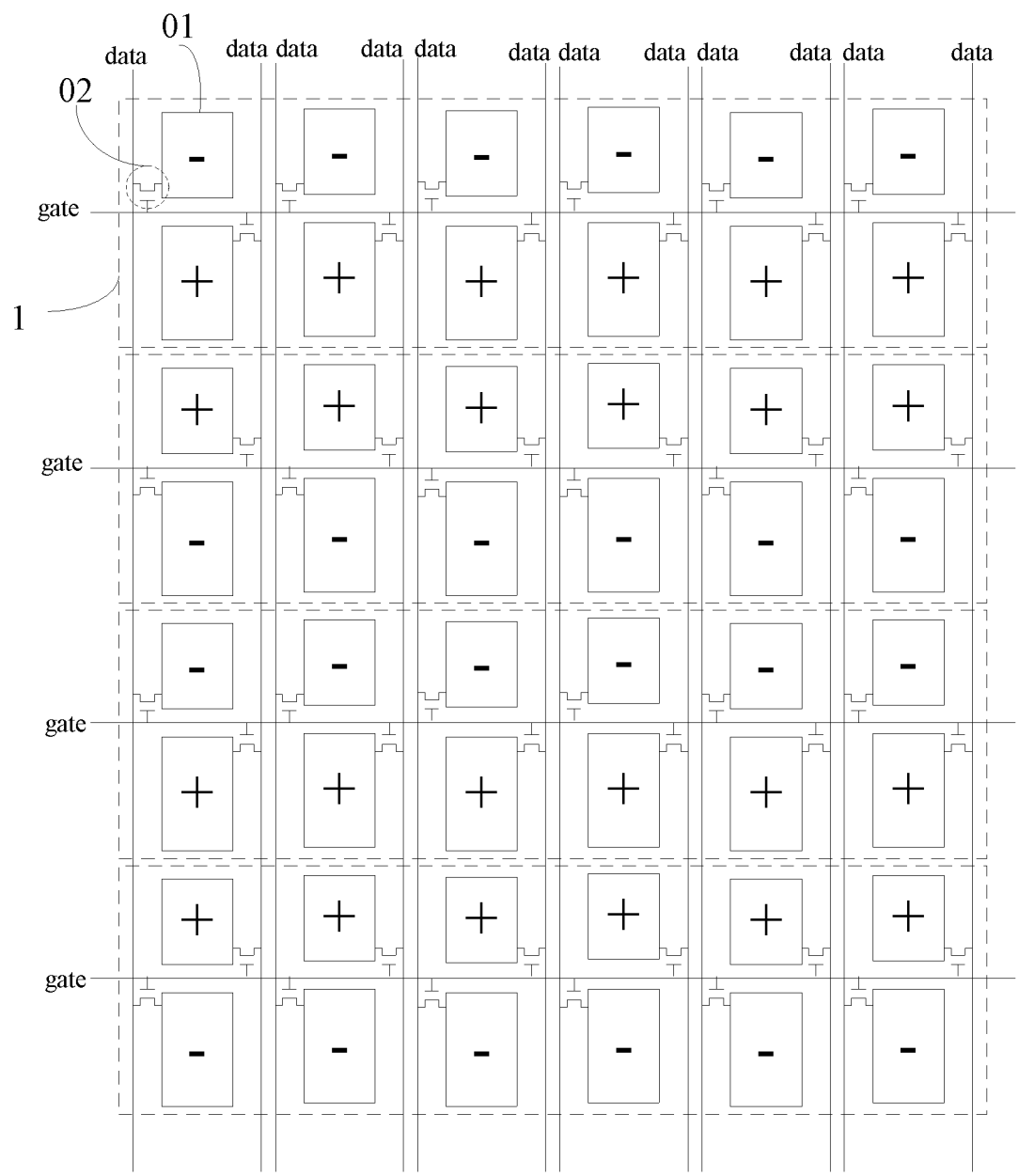
FIGS. 10a and 10b are schematic diagrams of polarity distribution of data signals applied to respective pixels of an array substrate provided by a sixth embodiment, respectively.
Figure 10B:
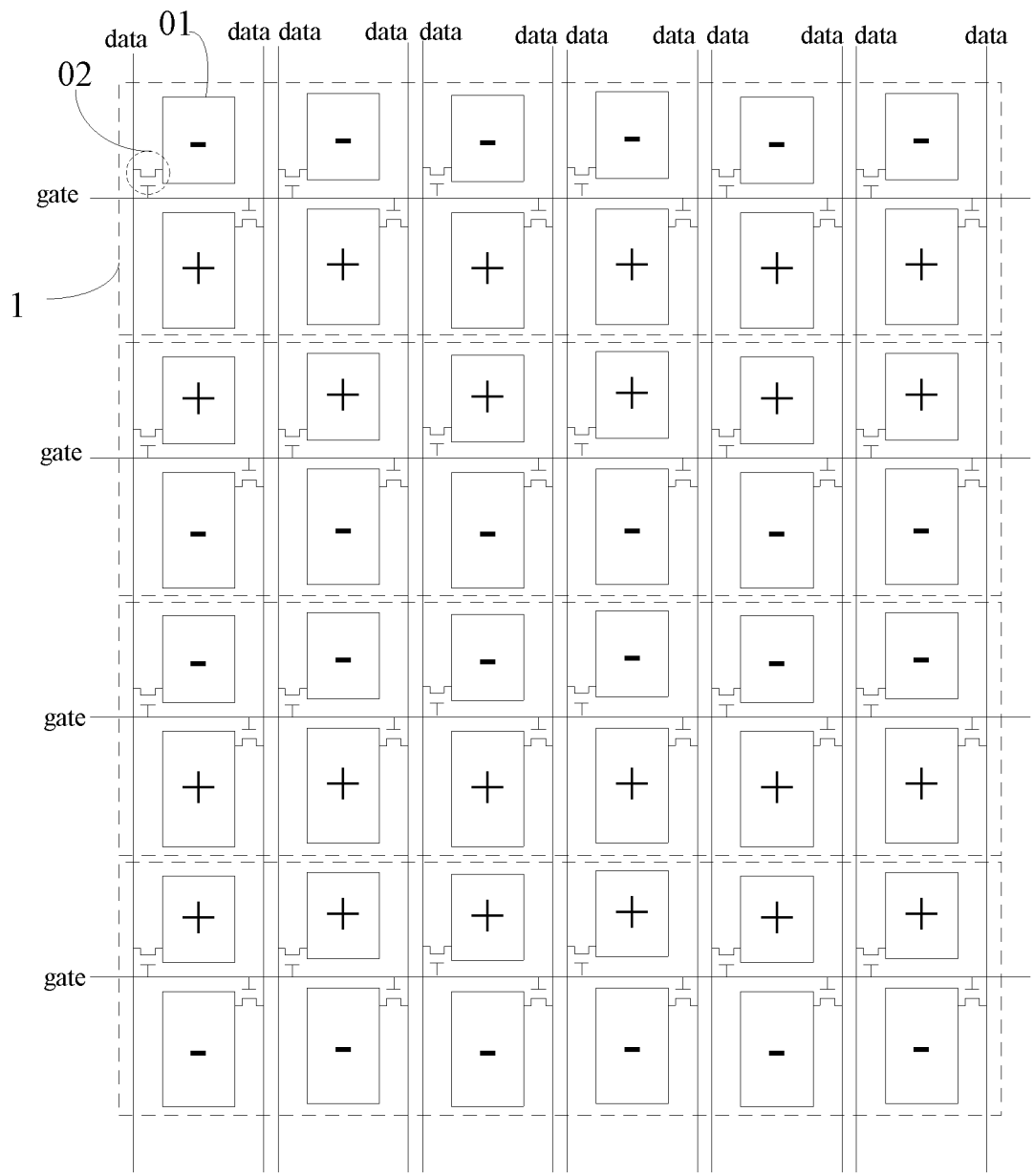
Figure 11A:
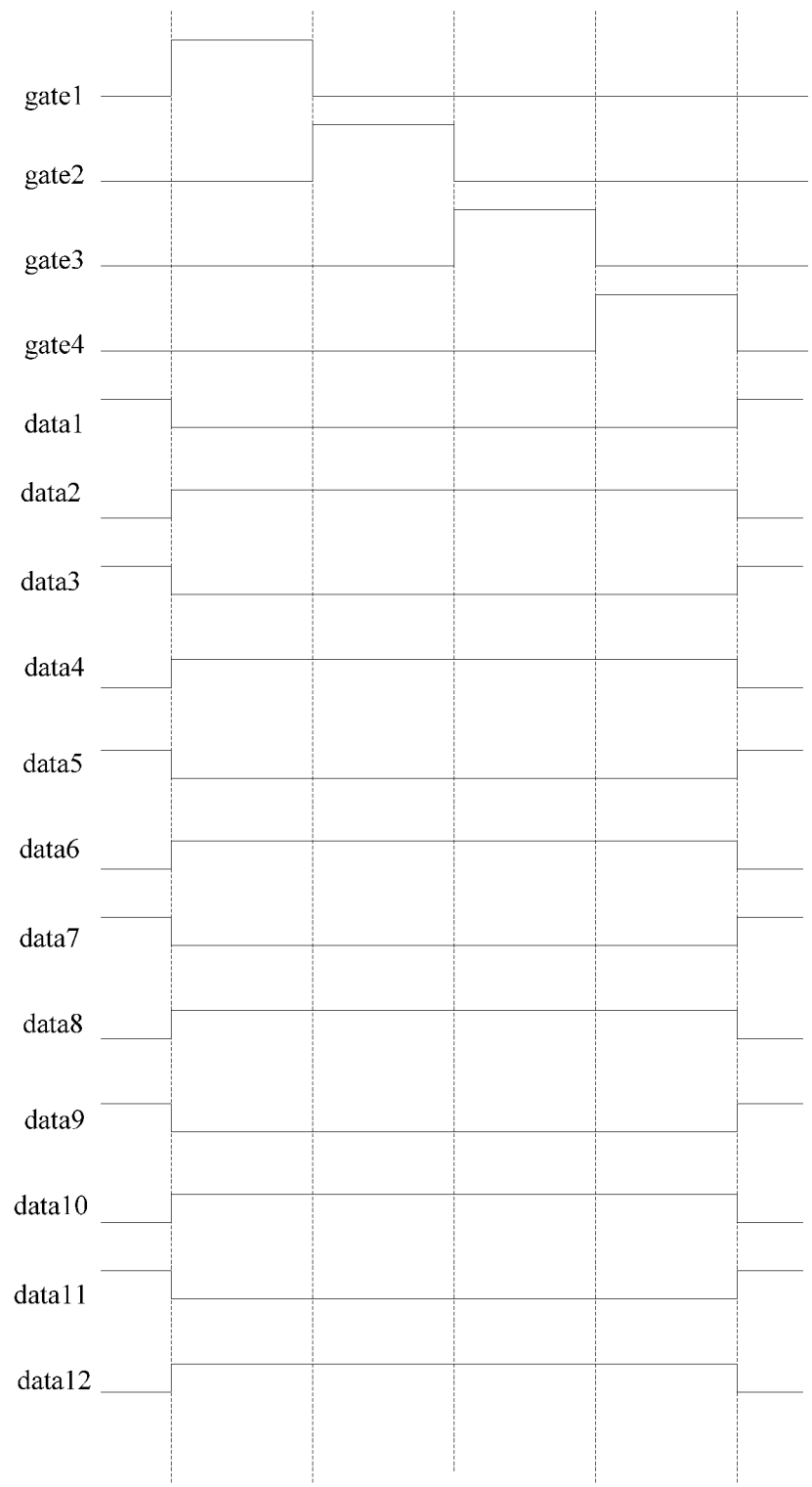
FIGS. 11a and 11b are timing diagrams corresponding to the array substrate provided by the sixth embodiment, respectively.
Figure 11B:
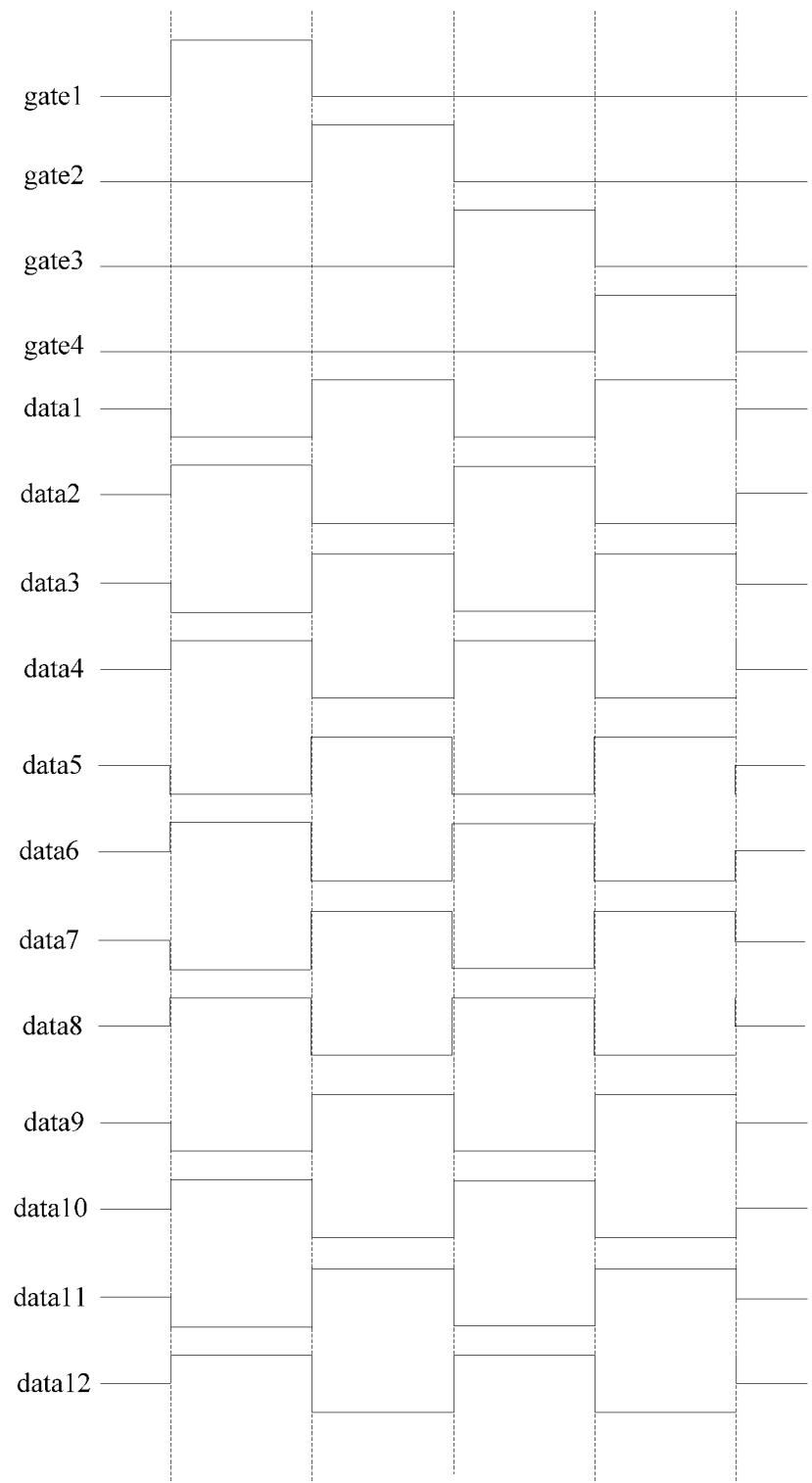

Optionally, on a basis of the array substrate provided by the fourth embodiment, data signals applied by the source driver to pixels in a first row belonging to an odd-numbered pixel group have a same polarity as data signals applied to pixels in a second row belonging to an even-numbered pixel group. Schematic diagrams of polarities of data signals applied to respective pixels 01 of the array substrate during a frame are shown in FIGS. 10a and 10b respectively. Timing diagrams of data signals applied to respective data lines during a frame are shown in FIGS. 11a and 11b respectively. As can be seen from FIGS. 10a and 10b, data signals applied to two adjacent rows of pixels 01 in a same pixel group 1 have different polarities, that is, a driving mode of row inversion is employed, such that liquid crystal molecules in regions corresponding to the two adjacent rows of pixels in the same pixel group have different rotation angles, thereby achieving effects of multi-domain display. And as can be seen from FIGS. 11a and 11b, the driving mode of row inversion is employed easily through timing control.

It should be noted that, in FIGS. 6a and 6b, FIGS. 9a and 9b, and FIGS. 11a and 11b, gate n (n=1, 2, 3, 4) represents a scanning signal on an $n^{th}$ gate line counted from the top down, and data m (m=1, 2, 3, . . . , 12) represents a data signal on a $m^{th}$ data line from left to right.

Based on a same inventive concept, an embodiment of the present disclosure further provides a driving method for the array substrate as shown in FIGS. 1a to 2b, including: scanning, by a gate driver, a gate line; enabling, by a source driver, application of a data signal to each pixel connected with the gate line by applying a data signal to a data line, wherein data signals applied to any two pixels connected with the gate line and adjacent to each other along a column direction have opposite polarities.

Specifically, the gate driver scans gate lines progressively within a period of one frame. The source driver applies a data signal to each pixel connected with an $n^{th}$ gate line by applying the data signal to each data line, when the gate driver scans the $n^{th}$ gate line. Data signals applied by the source driver to any two pixels connected with the $n^{th}$ gate line and adjacent to each other along a column direction have opposite polarities, wherein N is the number of gate lines on the array substrate and is a integer greater than or equal to 2, and n is a positive integer having a value from 1 to N.

Optionally, in the above driving method provided by the embodiment of the present disclosure, data signals applied by the source driver to any two pixels adjacent to each other along a row direction have opposite polarities.

Further, in the above driving method provided by the embodiment of the present disclosure, data signals applied by the source driver to any two pixels adjacent to each other along a column direction have opposite polarities.

Further, in the above driving method provided by the embodiment of the present disclosure, data signals applied by the source driver to any two pixels adjacent to each other along a row direction have a same polarity.

Optionally, in the above driving method provided by the embodiment of the present disclosure, data signals applied by the source driver to all odd-numbered rows of pixels have a same polarity, and data signals applied by the source driver to all even-numbered rows of pixels have a same polarity.

Optionally, in the above driving method provided by the embodiment of the present disclosure, data signals applied by the source driver to pixels in a first row belonging to any odd-numbered pixel group have a same polarity as data signals applied to pixels in a second row belonging to any even-numbered pixel group.

Based on a same inventive concept, an embodiment of the present disclosure further provides a display panel, including any array substrate provided by the embodiments of the present disclosure. Since the principle that the display panel addresses the problems is similar to the array substrate described above, for implementations of the display panel, reference may be made to the implementations of the above array substrate, which will not repeated.

In the array substrate, the driving method thereof and the display panel provided by the embodiments of the present disclosure, data lines are respectively arranged at two sides of each column of pixels, and two data lines are arranged between two adjacent column of pixels; taking two adjacent rows of pixels as a pixel group, a gate line is arranged between two adjacent rows of pixels located in each pixel group, and two rows of pixels in a same pixel group are connected with one gate line located between the two rows of pixels though respective corresponding switching elements; two pixels adjacent to each other along a column direction in a same pixel group are respectively connected with two data lines respectively located at two sides of a column where the two pixels are located through respective corresponding switching elements. Since two pixels adjacent to each other along a column direction and connected with a same gate line are connected with two different data lines, such a structure enable different rotation angles of liquid crystal molecules in regions corresponding to the two pixels by respectively controlling voltages of the two data lines, thereby realizing multi-domain display. Furthermore, the array substrate provided by the embodiments of the present disclosure has a relatively simple manufacturing process that is easy to implement.

Apparently, for a person skilled in the art, various modifications and variations may be made to the present disclosure without departing from the spirit and scope of the present disclosure. As such, if these modifications and variations of the present disclosure fall within the scope of the claims of the present disclosure and equivalent techniques thereof, the present disclosure is intended to include these modifications and variations.

What is claimed is:

1. An array substrate, comprising:
   a plurality of pixels arranged in a matrix, wherein the plurality of pixels are grouped into at least one pixel group, and two adjacent rows of pixels are grouped into a pixel group;
   a plurality of switching elements respectively connected with the plurality of pixels;
   data lines, wherein two data lines correspond to each column of pixels and are arranged at two sides of each column of pixels respectively; and
   at least one gate line each located between two adjacent rows of pixels of each of the at least one pixel group;
   wherein respective pixels in a same pixel group are connected with one of the at least one gate line that is located between two rows of pixels in the same pixel group though respective switching elements of the respective pixels;
   each pixel group comprises a plurality of columns of pixels, two pixels in a same column of the each pixel group are respectively connected with two data lines respectively located at two sides of a column where the two pixels are located through respective switching elements of the two pixels;
   the plurality of switching elements comprise transistors, and in the same pixel group, a ratio of areas of the two pixels in the same column is equal to a ratio of channel widths of the transistors corresponding to the two pixels;
   in the same pixel group, the ratio of channel widths of the transistors corresponding to the two pixels in each column is equal to a ratio of channel widths of transistors corresponding to two pixels in respective columns other than the each column;
   among the plurality of pixels arranged in the matrix, an area of each pixel in odd-numbered rows is a first area, an area of each pixel in even-numbered rows is a second area, and the first area is smaller than the second area;
   among the pixels in the same column, the pixels each having the first area and the pixels each having the second area are alternately arranged; and
   each pixel group consists of the pixels each having the first area and the pixels each having the second area, and the first area and the second area are different;
   wherein two rows of pixels are arranged between adjacent two rows of gate lines, a first row of pixels and a second row of pixels adjacent to and arranged respectively at two opposite sides of a first gate line of the adjacent two rows of gate lines form a first pixel group, a third row of pixels and a fourth row of pixels adjacent to and arranged respectively at two opposite sides of a second gate line of the adjacent two rows of gate lines form a second pixel group;
   the first row of pixels, the second row of pixels, the third row of pixels, and the fourth row of pixels arranged in sequence in a column direction, and the second row of pixels and the third row of pixels are arranged between the first gate line and the second gate line;
   the first row of pixels of the first pixel group and the fourth row of pixels of the second pixel group are connected to an identical data line; or
   the first row of pixels of the first pixel group and the third row of pixels of the second pixel group are connected to an identical data line.

2. The array substrate according to claim 1, further comprising a gate driver connected with each gate line and a source driver connected with each data line, wherein,
   the gate driver is configured to scan gate lines progressively within a period of one frame; and
   the source driver is configured to apply a data signal to each pixel connected with an $n^{th}$ gate line by applying the data signal to each data line in the case that the gate driver scans the $n^{th}$ gate line, wherein data signals applied by the source driver to any two pixels connected with the $n^{th}$ gate line and adjacent to each other along the column direction have opposite polarities, and N is the number of the gate lines on the array substrate and is a integer greater than or equal to 2, and n is a positive integer having a value from 1 to N.

3. The array substrate according to claim 2, wherein data signals applied by the source driver to any two pixels adjacent to each other along a row direction have opposite polarities.

4. The array substrate according to claim 3, wherein data signals applied by the source driver to any two pixels adjacent to each other along the column direction have opposite polarities.

5. The array substrate according to claim 2, wherein the data signals applied by the source driver to any two pixels adjacent to each other along a row direction have a same polarity.

6. The array substrate according to claim 5, wherein data signals applied by the source driver to all odd-numbered rows of pixels have a same polarity, and data signals applied by the source driver to all even-numbered rows of pixels have a same polarity.

7. The array substrate according to claim 5, wherein data signals applied by the source driver to pixels in a first row belonging to any odd-numbered pixel group have a same polarity as data signals applied to pixels in a second row belonging to any even-numbered pixel group.

8. The array substrate according to claim 1, wherein the plurality of switching elements comprises thin film transistors.

9. A display panel, comprising the array substrate according to claim 1.

10. A driving method for the array substrate according to claim 1, wherein the array substrate further comprises a gate driver connected with the gate line and a source driver connected with the data line; and the method comprises:
    scanning, by the gate driver, the at least one gate line; and
    applying, by the source driver, a data signal to each pixel connected with each gate line by applying a data signal to the data line, wherein data signals applied to any two pixels connected with the gate line and adjacent to each other along a column direction have opposite polarities.

11. The driving method according to claim 10, wherein the plurality of pixels is grouped into a plurality of pixel groups; in a same column of pixels, a pixel in a first row belonging to an odd-numbered pixel group is connected with a same data line as a pixel in a second row of pixels belonging to an even-numbered pixel group; or in a same column of pixels, a pixel in a first row belonging to an odd-numbered pixel group is connected with a same data line as a pixel in a first row belonging to an even-numbered pixel group;
    the scanning, by the gate driver, the at least one gate line comprises:
    scanning, by the gate driver, gate lines progressively within a period of one frame; and
    the applying, by the source driver, a data signal to each pixel connected with each gate line by applying a data signal to the data line comprises:
    applying, by the source driver, a data signal to each pixel connected with an $n^{th}$ gate line by applying the data signal to each data line in the case that the gate driver scans the $n^{th}$ gate line, wherein the data signals applied by the source driver to any two pixels connected with the $n^{th}$ gate line and adjacent to each other along the column direction have opposite polarities, and N is the number of gate lines on the array substrate and is a integer greater than or equal to 2, and n is a positive integer having a value from 1 to N.

12. The driving method according to claim 11, wherein data signals applied by the source driver to any two pixels adjacent to each other along a row direction have opposite polarities.

13. The driving method according to claim 12, wherein data signals applied by the source driver to any two pixels adjacent to each other along the column direction have opposite polarities.

14. The driving method according to claim 11, wherein data signals applied by the source driver to any two pixels adjacent to each other along a row direction have a same polarity.

15. The driving method according to claim 14, wherein data signals applied by the source driver to all odd-numbered rows of pixels have a same polarity, and data signals applied by the source driver to all even-numbered rows of pixels have a same polarity.

16. The driving method according to claim 14, wherein data signals applied by the source driver to pixels in a first row belonging to any odd-numbered pixel group have a same polarity as data signals applied to pixels in a second row belonging to any even-numbered pixel group.

17. The array substrate according to claim 1, wherein in the same pixel group, the areas of the two pixels in the same column are different.

\* \* \* \* \*